US009325145B2

(12) United States Patent
Neil et al.

(10) Patent No.: US 9,325,145 B2
(45) Date of Patent: Apr. 26, 2016

(54) METHOD FOR SEPARATING FEL OUTPUT BEAMS FROM LONG WAVELENGTH RADIATION

(71) Applicant: JEFFERSON SCIENCE ASSOCIATES, LLC, Newport News, VA (US)

(72) Inventors: George Neil, Williamsburg, VA (US); Michelle D. Shinn, Newport News, VA (US); Joseph Gubeli, Gloucester, VA (US)

(73) Assignee: JEFFERSON SCIENCE ASSOCIATES, LLC, Newport News, VA (US)

( * ) Notice: Subject to any disclaimer, the term of this patent is extended or adjusted under 35 U.S.C. 154(b) by 0 days.

(21) Appl. No.: 14/708,551

(22) Filed: May 11, 2015

(65) Prior Publication Data

US 2015/0325974 A1 Nov. 12, 2015

Related U.S. Application Data

(60) Provisional application No. 61/991,959, filed on May 12, 2014.

(51) Int. Cl.

| | |
|---|---|
| ***H01S 3/00*** | (2006.01) |
| ***H01S 3/09*** | (2006.01) |
| ***H01S 3/08*** | (2006.01) |
| ***H01S 5/028*** | (2006.01) |
| *H01S 5/183* | (2006.01) |

(52) U.S. Cl.

CPC ............. *H01S 3/0903* (2013.01); *H01S 3/0805* (2013.01); *H01S 3/08068* (2013.01); *H01S 5/0286* (2013.01); *H01S 5/18375* (2013.01)

(58) Field of Classification Search

CPC . H01S 3/0903; H01S 3/08068; H01S 3/0805; H01S 5/0286; H01S 5/18375

See application file for complete search history.

(56) References Cited

U.S. PATENT DOCUMENTS

| | | | | |
|---|---|---|---|---|
| 4,742,522 | A * | 5/1988 | Linford | H01S 3/0903 372/101 |
| 4,876,687 | A * | 10/1989 | Feinstein | H05H 7/04 315/4 |
| 5,247,562 | A * | 9/1993 | Steinbach | H05G 2/00 372/22 |
| 5,353,291 | A * | 10/1994 | Sprangle | H01S 4/00 372/10 |
| 5,805,620 | A * | 9/1998 | Liu | H01S 3/0903 372/2 |
| 5,960,013 | A * | 9/1999 | Sheffield | H01S 3/0903 372/2 |
| 6,313,461 | B1 * | 11/2001 | McClelland | B82Y 15/00 250/305 |

* cited by examiner

*Primary Examiner* — Yuanda Zhang

(57) ABSTRACT

A method for improving the output beam quality of a free electron laser (FEL) by reducing the amount of emission at wavelengths longer than the electron pulse length and reducing the amount of edge radiation. A mirror constructed of thermally conductive material and having an aperture therein is placed at an oblique angle with respect to the beam downstream of the bending magnet but before any sensitive use of the FEL beam. The aperture in the mirror is sized to deflect emission longer than the wavelength of the FEL output while having a minor impact on the FEL output beam. A properly sized aperture will enable the FEL radiation, which is coherent and generally at a much shorter wavelength than the bending radiations, to pass through the aperture mirror. The much higher divergence bending radiations will subsequently strike the aperture mirror and be reflected safely out of the way.

10 Claims, 5 Drawing Sheets

Undesirable long wavelength radiation

12

10

METHOD FOR SEPARATING FEL OUTPUT BEAMS FROM LONG WAVELENGTH RADIATION

CROSS-REFERENCE TO RELATED APPLICATIONS

This application claims the priority of Provisional U.S. Patent Application Ser. No. 61/991,959 filed May 12, 2014.

GOVERNMENT LICENSE RIGHTS

This invention was made with government support under Management and Operating Contract No. DE-AC05-060R23177 awarded by the Department of Energy. The United States Government has certain rights in the invention.

FIELD OF THE INVENTION

The present invention relates to lasers that are tunable in frequency and more particularly to a method for reducing the amount of edge radiation and coherent synchrotron emission and reducing the amount of emission at wavelengths longer than the electron pulse length in a free electron laser.

BACKGROUND OF THE INVENTION

The output beam of a Free Electron Laser (FEL) is typically emitted from the end of a wiggler (also called an undulator) in a narrow cone (see FIG. 1) which diffracts slowly and is initially travelling along the same line as the electron beam that produced it. If this radiation is to be used, the electron beam is separated from the optical power beam by means of a bending magnet. One consequence of this bending is that is in addition to the presence of the FEL photons, output radiation is produced by means of collective synchrotron emission at wavelengths longer than the electron pulse length (see FIGS. 2, 3, and 4). Also radiation known as edge radiation is produced at the transitions of the electron beam into and out of the bending magnetic field. These additional photon sources may be of high power and are generally undesirable as they may interfere with the use of the FEL output by giving incorrect signals on detectors, heating mirrors or otherwise negatively impacting the planned use of the FEL output. Accordingly, there is a need for an FEL system that produces an output radiation with reduced amounts of emission at wavelengths longer than the electron pulse length and reduced amounts of edge radiation.

OBJECT OF THE INVENTION

A first object of the invention is to provide a method for improving the output beam quality of a free electron laser (FEL).

A second object of the invention, in a laser that is tunable in frequency, is to provide a reduction in the amount of emission in the output of the FEL at wavelengths longer than the electron pulse length.

A further object of the invention is to provide a reduction in the amount of edge radiation in the output of an FEL.

A further object of the invention is to reduce the collective synchrotron emission at wavelengths longer than the electron pulse length caused by the bending magnet that redirects an FEL output beam for purposes of sensitive use of the beam.

A further object of the invention is to place a mirror with an aperture therein at an oblique angle downstream of an FEL bending magnet but before any sensitive use of the FEL beam for reducing wavelengths longer than the electron pulse length in the output of the FEL.

A further object of the invention is to place a mirror with an aperture therein at an oblique angle downstream of an FEL bending magnet but before any sensitive use of the FEL beam for reducing the amount of edge radiation in the output of the FEL.

A further object of the invention is to provide a mirror with an aperture therein with the aperture sized to deflect emissions longer than the electron pulse length while having a minor impact on the FEL output beam.

BRIEF SUMMARY OF THE INVENTION

According to the present invention there is provided a method for improving the output beam quality of a free electron laser (FEL) including reducing the amount of emission at wavelengths longer than the electron pulse length and reducing the amount of edge radiation. To reduce the effects of undesirable radiation on the output of an FEL, a mirror, constructed of thermally conductive material having an aperture therein, is placed at an oblique angle with respect to the beam downstream of the bending magnet but before any sensitive use of the FEL beam. The aperture in the mirror is sized to deflect emission longer than the wavelength of the FEL output while having a minor impact on the FEL output beam. A properly sized aperture will enable the FEL radiation, which is coherent and generally at a much shorter wavelength than the bending radiations, to pass through the aperture mirror. The much higher divergence bending radiations will subsequently strike the aperture mirror and be reflected safely out of the way, such as into a dump to absorb the power or into a secondary set of sensors designed for these particular radiations.

DETAILED DESCRIPTION

The present invention uses the difference in the divergence properties of the two sets of radiations, including FEL radiation and undesirable radiation from the bend, in order to reduce the amounts of emission at wavelengths longer than the electron pulse length and reduce the amounts of edge radiation in the output of the FEL.

Figure 1:
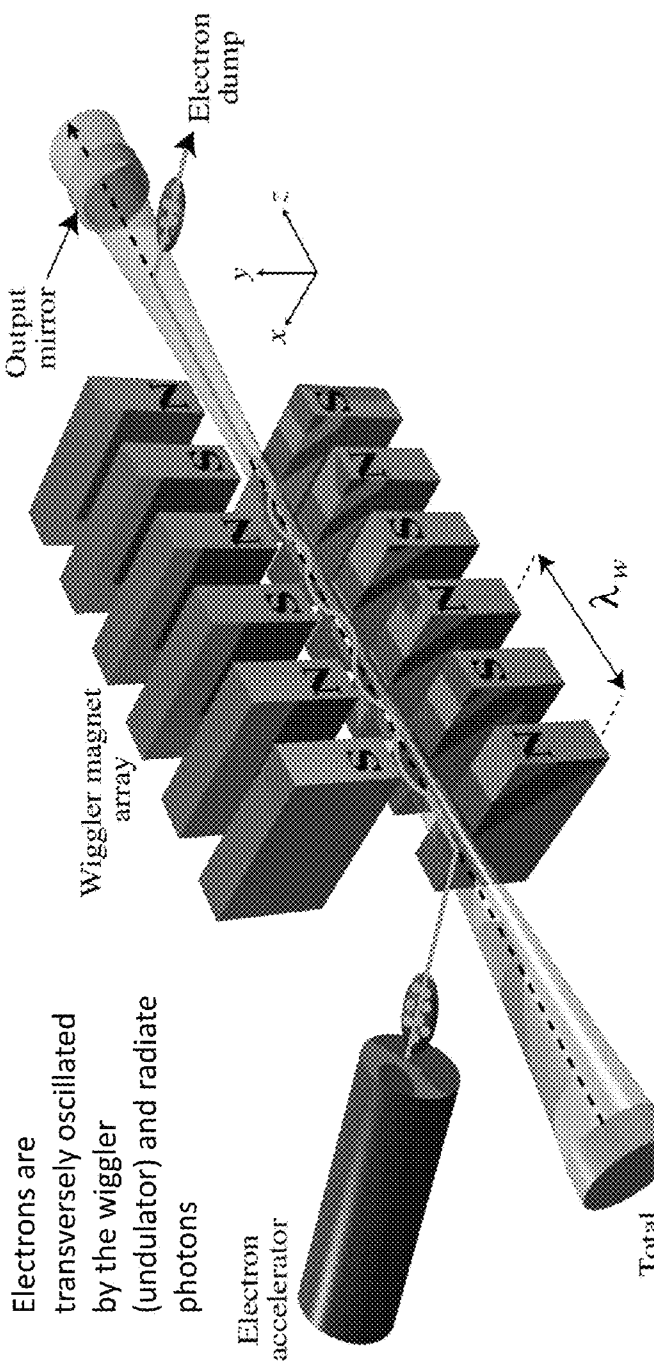
FIG. 1 depicts the layout of a conventional FEL in resonator configuration.
Figure 2:
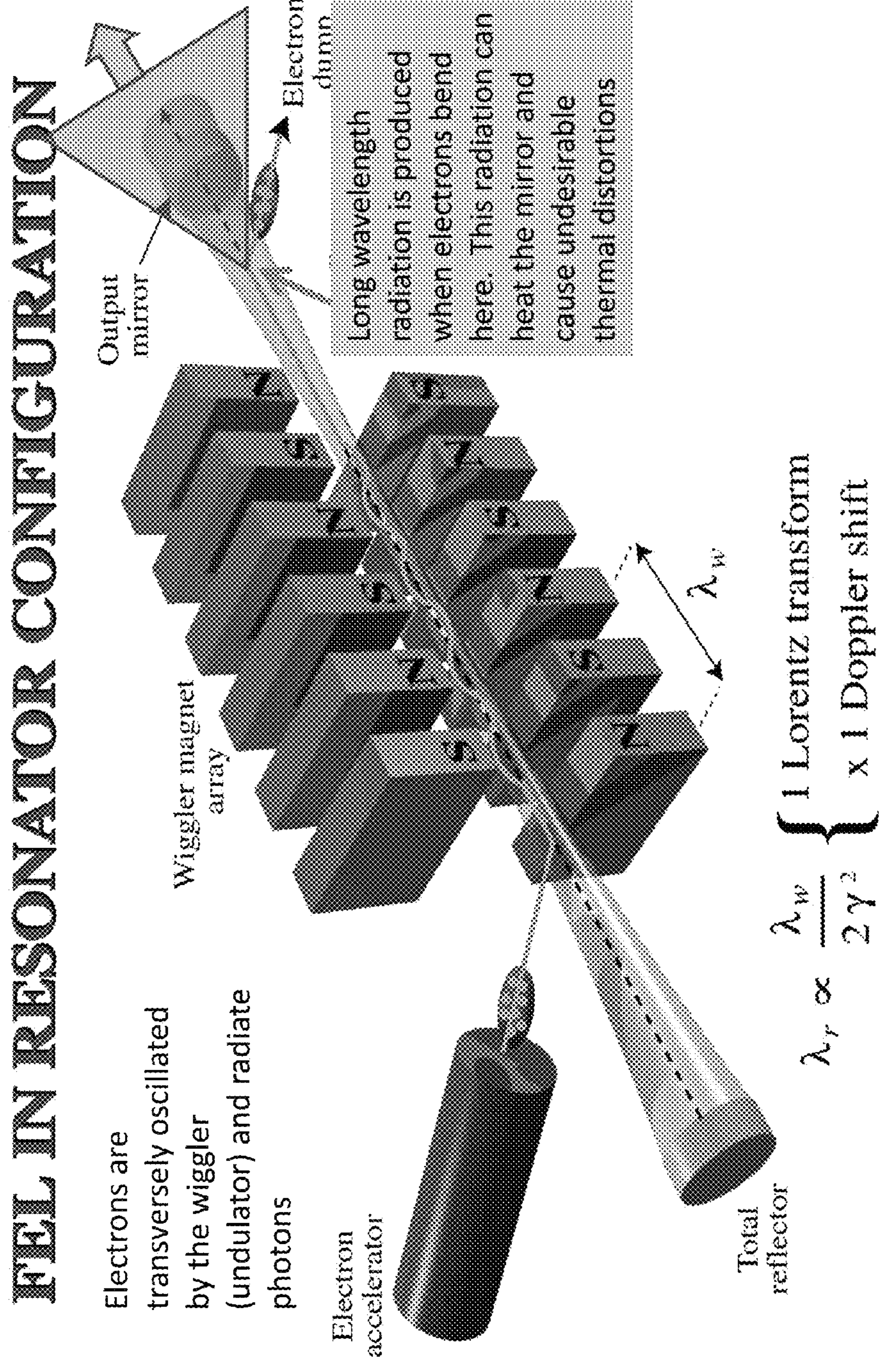
FIG. 2 is a layout of an FEL in resonator configuration depicting the long wavelength radiation produced by the bending mirror.
Figure 3:
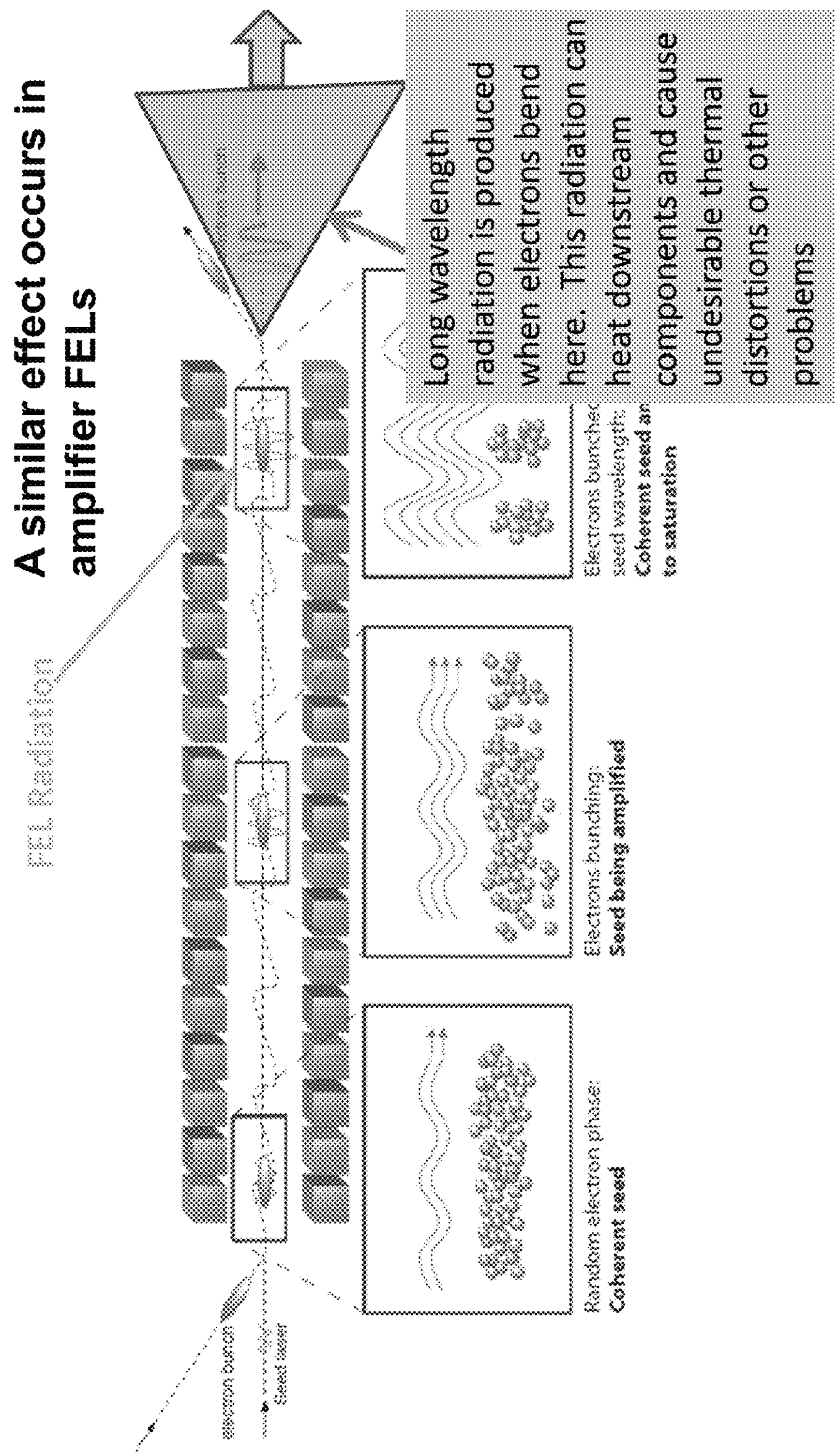
FIG. 3 depicts the layout of a conventional amplifier FEL.
Figure 4:
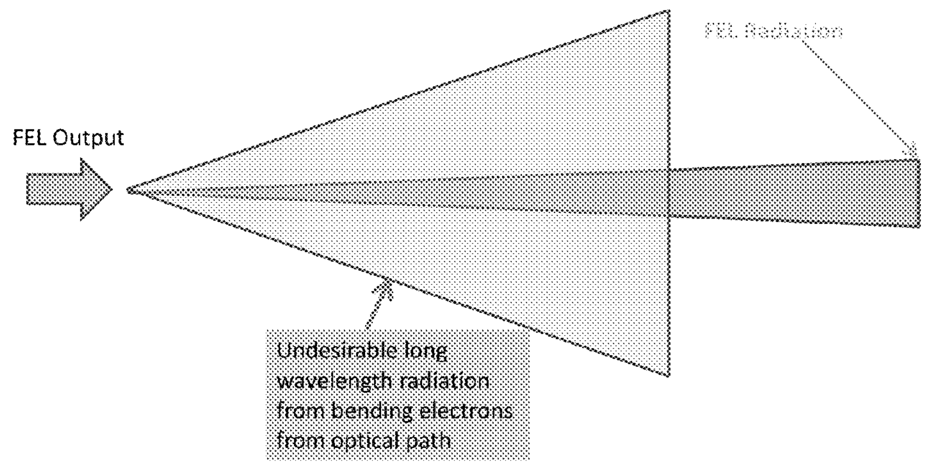
FIG. 4 is a conceptual drawing depicting the results of undesirable long wavelength radiation on the output of an FEL.
Figure 5:
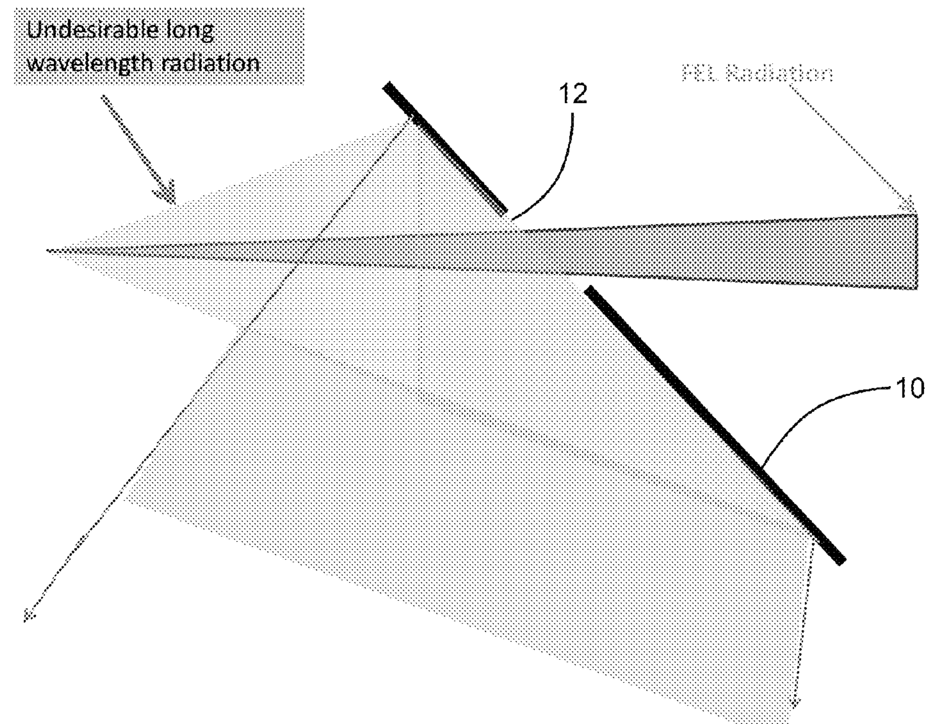
FIG. 5 depicts a method for separating FEL output beams from long wavelength radiation according to the current invention.
Figure 6:
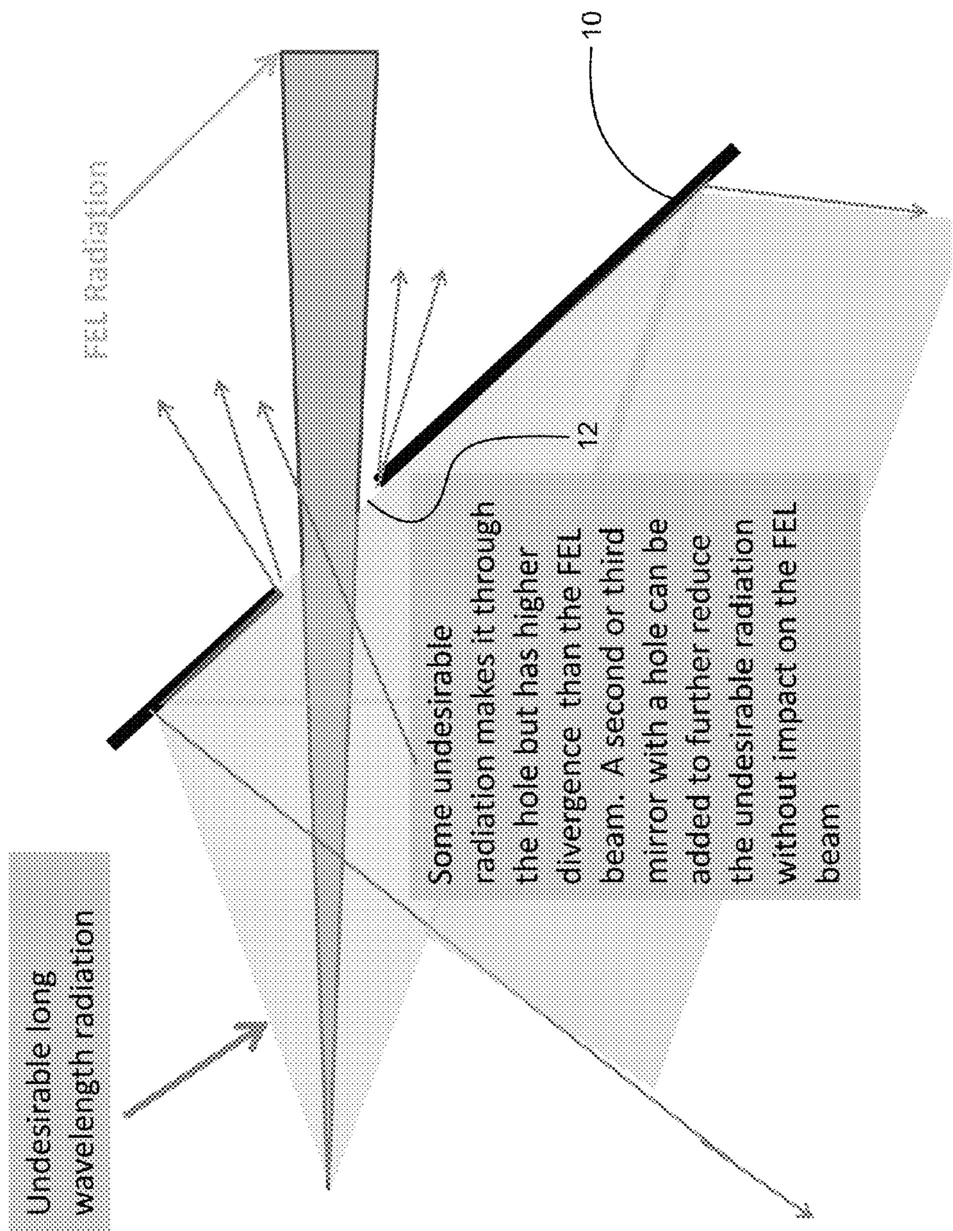
FIG. 6 depicts the method of the present invention for separating FEL output beams from long wavelength radiation.

As shown in FIGS. 5 and 6, in order to reduce the effects of undesirable radiation a mirror 10, having an aperture 12 in the middle, is placed at an oblique angle, such as 45 degrees as shown in FIG. 5, downstream of the bending magnet but before any sensitive use of the FEL beam. The size of the aperture in the mirror is precisely machined so that the impact on the FEL beam is minor. Since it is generally at a much shorter wavelength than the bending radiations and the output beam is coherent a small aperture in the mirror will pass the FEL radiation. The much higher divergence bending radiations will strike this mirrors and be reflected safely out of the way, such as into a dump to absorb the power or into a secondary set of sensors designed for these particular radiations.

It is possible that some small portion of these longer wavelength radiations may pass through the aperture. If the level of these remaining undesirable wavelengths is still too high, then the process can be repeated taking advantage of the higher diffraction occurring for the longer wavelengths. In this way, the comparatively long wavelength radiation in the FEL output can be reduced to tolerable levels. This is superior to allowing the bending radiation to impact the operation of the FEL mirrors as is typically done in conventional FELs.

The equation describing the output wavelength of the FEL radiation is $$\lambda_s = \frac{\lambda_w}{2\gamma^2}(1 + K^2)$$

where:

$\lambda_s$ is the output wavelength;

$\lambda_w$ is the wiggler wavelength;

$\gamma$ is the relativistic parameter of the electrons=1+E/0.511 where E is the electrons' kinetic energy in units of megaelectron volts; and K is the wiggler strength parameter, $$K = \frac{eB}{k_0 mc^2}$$

where e is the electron charge, B is the magnetic field strength of the wiggler, $k_0=2\pi/\lambda_w$, m is the electron rest mass and c is the speed of light.

The radius of the optical mode of the FEL beam is given by $$\omega = \omega_0\sqrt{1 + \left(\frac{z\lambda_s}{\pi\omega_0^2}\right)^2}$$

where:

$\omega_0$ is the radius of the FEL optical mode in the wiggler; and z is the distance from the wiggler where the radius is to be determined.

According to the present invention, in order for the mirror to not negatively affect the FEL optical mode, the radius of the aperture in the mirror must be much larger than the radius of the FEL optical mode at that point. Preferably the mirror's aperture radius must be greater than 3 times the FEL optical mode at that point. The mirror is at an angle and what is important is the radius as projected onto the FEL beam. Preferably, to control the radius as projected onto the FEL beam, the aperture in the mirror is shaped circular or elliptical.

The apertured mirror is placed at an oblique angle, such as shown in FIG. 5, downstream of the bending magnet but before any sensitive use of the FEL beam. Preferably the apertured mirror is placed at an angle $\theta$ of between 10 and 80 degrees with respect to the FEL beam axis, more preferably at an angle of between 30 and 60 degrees with respect to the FEL beam axis, and most preferably at an angle of between 40 and 50 degrees with respect to the FEL beam axis.

The mirror is preferably constructed of a thermally conductive material which reflects long wavelength radiation. Preferably, the mirror should be capable of taking a smooth polish to form a mirror surface. Preferably, for the mirror to handle the high power of an FEL, the mirror is constructed of a thermally conductive metal. Other materials with high thermal conductivity could also be used such as Si, SiC, sapphire, and diamond. More preferably, the mirror is constructed of molybdenum or copper. Most preferably, the mirror is constructed of copper, which is highly thermally conductive (having a thermal conductivity of 401 W/mK), capable of being highly polished to form a smooth mirror finish, and is capable of being machined with a precision aperture therein. The mirror substrate may be coated with a high reflectivity coating. Preferred materials for the high reflectivity coating include gold and silver.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments herein were chosen and described in order to best explain the principles of the invention and the practical application, and to enable others of ordinary skill in the art to understand the invention for various embodiments with various modifications as are suited to the particular use contemplated.

What is claimed is:

1. A method for improving the quality of the output of a free electron laser (FEL) having an optical wavelength and a bending magnet deflecting electrons from the output laser beam, comprising:

a. providing a mirror with an aperture therein;

b. sizing the aperture to deflect emission longer than the wavelength of the FEL output;

c. inserting the mirror at an oblique angle downstream of the bending magnet but before any sensitive use of the FEL beam;

d. determining the output wavelength of the FEL radiation by solving the equation $$\lambda_s = \frac{\lambda_w}{2\gamma^2}(1 + K^2)$$

where:

$\lambda_s$ is the output wavelength;

$\lambda_w$ is the wiggler wavelength;

$\gamma$ is the relativistic parameter of the electrons=1+E/0.511 where E is the electrons' kinetic energy in units of megaelectron volts;

K is the wiggler strength parameter, $$K = \frac{eB}{k_0 mc^2}$$

where e is the electron charge, B is the magnetic field strength of the wiggler, $k_0=2\pi/\lambda_w$, m is the electron rest mass and c is the speed of light;

e. determining the radius of the optical mode of the FEL beam by solving the equation $$\omega = \omega_0 \sqrt{1 + \left(\frac{z\lambda_s}{\pi\omega_0^2}\right)^2}$$

where:

$\omega_0$ is the radius of the FEL optical mode in the wiggler; and z is the distance from the wiggler where the radius is to be determined; and f. setting the radius of the aperture to greater than 3 times the FEL optical mode at the insertion point of the mirror.

2. The method of claim 1, wherein the aperture is substantially circular or elliptical and includes a radius.

3. The method of claim 2, wherein the radius of the aperture as projected on the FEL optical mode is larger than the radius of the FEL optical mode at the insertion point of the mirror.

4. The method of claim 1, further comprising constructing the mirror of thermally conductive material.

5. The method of claim 1, further comprising constructing the mirror of thermally conductive metal.

6. The method of claim 1, further comprising selecting the material of construction of the mirror from the group including molybdenum and copper.

7. The method of claim 1, further comprising constructing the mirror of copper.

8. The method of claim 1, further comprising providing an upstream surface on the mirror; and polishing the upstream surface to form a mirror finish.

9. The method of claim 1, further comprising providing an upstream surface on the mirror;

polishing the upstream surface to form a mirror finish; and coating the mirror surface to enhance the mirror reflectivity at wavelengths longer than the primary FEL lasing wavelength.

10. The method of claim 9, further comprising selecting the material of construction of the mirror coating from the group including gold and silver.

* * * * *